United States Patent [19]

Goetzke et al.

[11] 4,110,549
[45] Aug. 29, 1978

[54] ENVIRONMENTALLY PROTECTED ELECTRONIC HOUSING AND HEAT SINK STRUCTURE, PARTICULARLY FOR AUTOMOTIVE USE

[75] Inventors: Siegfried Goetzke, Hemmingen; Gert Jakob, Stuttgart, both of Fed. Rep. of Germany

[73] Assignee: Robert Bosch GmbH, Stuttgart, Fed. Rep. of Germany

[21] Appl. No.: 773,057

[22] Filed: Feb. 28, 1977

Related U.S. Application Data

[62] Division of Ser. No. 628,225, Nov. 3, 1975, abandoned.

[30] Foreign Application Priority Data

Nov. 30, 1974 [DE] Fed. Rep. of Germany ....... 2456802

[51] Int. Cl.$^2$ .............................................. H05K 5/03
[52] U.S. Cl. .................................. 174/16 HS; 357/81
[58] Field of Search ............ 174/16 HS, 138 F, 50.51; 357/81; 361/386, 388; 150/52 R

[56] References Cited

U.S. PATENT DOCUMENTS

| | | | |
|---|---|---|---|
| 1,072,047 | 9/1913 | Shepard | 427/275 X |
| 2,714,912 | 8/1955 | Gonnella | 150/52 R |
| 3,228,445 | 1/1966 | Mayotte | 150/52 R |
| 3,377,524 | 4/1968 | Bock et al. | 361/388 X |
| 3,704,738 | 12/1972 | LeCompte | 150/52 R |
| 3,805,123 | 4/1974 | Rieger | 174/16 HS |

*Primary Examiner*—J. V. Truhe
*Assistant Examiner*—D. A. Tone
*Attorney, Agent, or Firm*—Flynn & Frishauf

[57] ABSTRACT

To mount power semiconductor units at the exposed surfaces of a housing structure for electronic components such as, for example, transistorized ignitions, without the loss of heat sink and heat radiation effects, while still protecting the electronic components, a protective cover is placed over the electronic component and at least a portion of the housing end wall, the cover being so dimensioned that it offers little resistance to radiation of heat by the housing end wall; the cover may be a layer of paint or a plastic hood or cap having end walls fitting against the housing end wall which are spaced from the electronic component by a distance which is sufficient to permit the housing end wall to act as a heat sink. If paint is used, the semiconductor is preferably located in a depression formed in the housing end wall so that paint can accumulate at the edges of the semiconductor thus providing effective protection.

18 Claims, 21 Drawing Figures

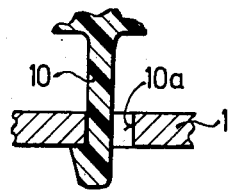
Fig.4
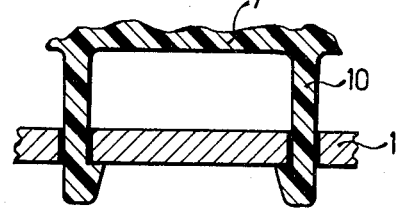
Fig.4a
Fig.5
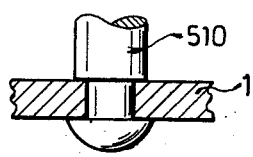
Fig.4b
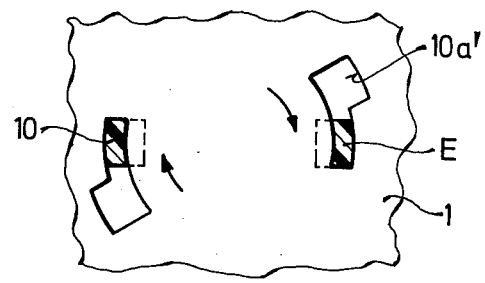
Fig.6a
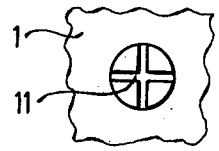
Fig.6b
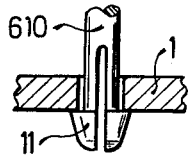
Fig.7
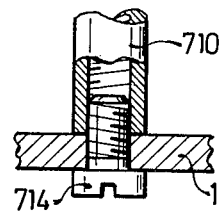
Fig.8
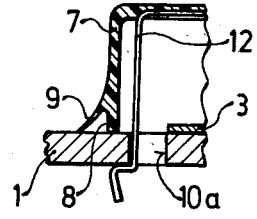
Fig.9a
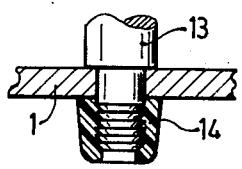
Fig.9b
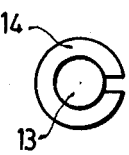

ENVIRONMENTALLY PROTECTED ELECTRONIC HOUSING AND HEAT SINK STRUCTURE, PARTICULARLY FOR AUTOMOTIVE USE

This is a division of application Ser. No. 628,225, filed Nov. 3, 1975, now abandoned.

The present invention relates to housing structures for electronic apparatus, and more particularly to environmentally protected housing structures for automotive use, especially to transistorized ignition systems for internal combustion engines, in which the housing structure forms part of the heat sink for power semiconductors.

Electronic apparatus, such as transistorized ignition switching systems and the like, and usually enclosed in aluminum or other metal boxes. Semiconductor power elements, such as power transistors, must be located outside of these metal boxes to provide for effective heat radiation therefrom. The power semiconductor units are, therefore, especially subjected to environmental influences, such as water, saline solutions from road salting, and the like. Such installations, therefore, are subjected to severe environmental conditions, and failures may result.

It is an object of the present invention to provide an environmentally protected housing structure for electronic components in which power semiconductors may be located outside of the housing structure, without danger of damage due to enviromental influences.

SUBJECT MATTER OF THE PRESENT INVENTION

Briefly, a protective coating of a paint, such as lacquer or varnish, may be placed over the entire power semiconductor as well as over at least the adjacent portions of the free surface of the housing for the remainder of the electronic systems. In a preferred form, the end wall of the housing box for the electronic system is formed with a depression in which the power semiconductor is located, so that covering with a paint is facilitated.

In accordance with a feature of the invention, the free surface of the housing as well as of the power semiconductor is covered with a cap or hood, preferably made of plastic; this hood may be used instead of the paint coating, or in addition thereto, to cover the surface region of the end wall of the housing box in which the power semiconductor is located. The spacing between the engagement of the hood with the end wall is preferably so selected that sufficient surface area of the end wall is left between the power semiconductor and the line of contact of the hood, so that the end wall may act as a heat sink, or heat radiator.

The invention will be described by way of example with reference to the accompanying drawings, wherein:

FIG. 4 is a schematic fragmentary cross-sectional view illustrating an arrangement to attach the hood to the end wall;

FIG. 4a is a cross-sectional side view of another attachment arrangement;

FIG. 4b is a schematic top view of the attachment arrangement of FIG. 4a;

FIG. 5 is a fragmentary side view of yet another attachment arrangement;

FIG. 6a is a bottom view of an attachment arrangement;

FIG. 6b is a side view of the attachment of FIG. 6a;

FIG. 7 is a side view of another attachment arrangement;

FIG. 8 is a side view of another attachment arrangement;

FIG. 9a is a side view of another attachment arrangement;

FIG. 9b is an end view of the arrangement of FIG. 9a;

FIG. 10b is an internal end view of the arrangement of FIG. 10a;

Figure 1:
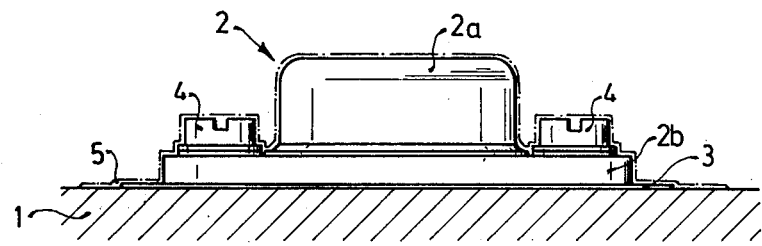
FIG. 1 is a schematic, part sectional, part pictorial side view of a power transistor mounted on the end wall of a transistorized ignition housing.

An electronic device, such as a transistorized ignition system including circuit components such as capacitors, resistors, inductances, and active semiconductor elements, are enclosed in the box-like structure, only one end wall 1 of which is shown. The transistorized ignition also utilizes power transistors. The housing structure 1 for the transistorized ignition is made of aluminum and serves as a heat sink for components used in the ignition circuitry. The power transistor, or one of the power transistors, or other heat-generating circuit component of the ignition system is enclosed in a housing 2 which includes a cap 2a and a base plate 2b. The base plate 2b is also one terminal of the semiconductor power element. This terminal, in many circuits, is at a voltage level which is different from the voltage level of the housing 1. Typically, the housing 1 is connected to ground or chassis of the vehicle. The base plate 2 therefore must be insulated with respect to the housing 1. To this end, an insulating disk 3 is located beneath the base plate 2a. Screws 4, passing through holes (not shown) in the housing structure 1, and insulated likewise from the base plate 2b by insulating washers, or the like, or themselves being made of insulating material, secure the semiconductor housing 2 to the end wall 1 of the ignition system.

In accordance with the present invention, the power semiconductor housing itself is protected against environmental damage by a protective paint, which may be a lacquer, varnish, or plastic base, and which extends over the entire free surface of the housing 2 of the power semiconductor element, over the surface of screws 4, over the free or end surface of insulating disk or plate 3 and, further, over an adjacent region of the surface of the housing 1, covering also the outer edge of the insulating disk or plate 3. The protective paint 5 thus protects the semiconductor elements against atmospheric influences, sprayed water, wash water, salt, saline fog, saline solution, and other environmental and atmospheric influences. Deposits from the atmosphere, particularly saline deposits, otherwise might form at the edges of the base plate 2b of the semiconductor housing and extend over the insulating plate 3 to the end plate 1 of the metal box enclosing the ignition system, thus forming stray or creep paths around the insulating disk 3. Electrolysis and corrosion of both the housing 2 of the power semiconductor, as well as of the end plate 1 may result, which eventually leads to short circuits, and thus failure of the entire system.

Figure 2:
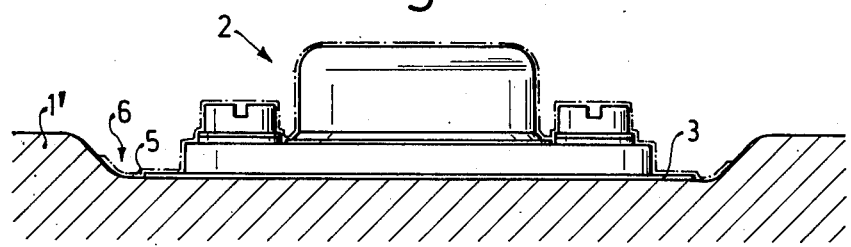
FIG. 2 is a view similar to FIG. 1, illustrating a modification in which the end wall is formed with a depression.

In a preferred form, the housing end wall 1 is formed with a depression 6 (FIG. 2) at that position where the power semiconductor element is to be secured. Thus, when the protective paint 5 is apppplied, run-off at the edges, particularly at the edges around the insulating plate 3, is avoided. The depression 6 thus provides a greater accumulation of protective paint at the usually sharp edges of the housing 2 of the power semiconductor element, as well as at the junction of the insulating plate 3 with the housing 2 on the one hand, and with the housing end wall 1 on the other.

Figure 3:
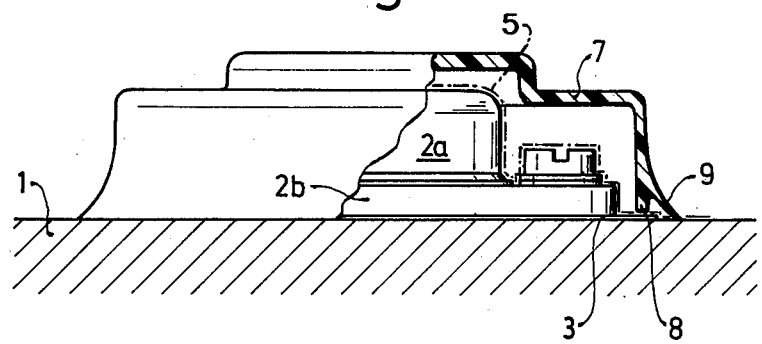
FIG. 3 is a side view of a power transistor covered by a protective hood, partly in section.

The semiconductor may also be protected by an outer protective cap or hood 7, as seen in FIG. 3. Hood 7 covers the free surface of the semiconductor housing 2, the free surface of screws 4, and the free surface of the insulating disk 3 as well as a ring zone of the surface of the end wall 1 of the semiconductor housing box, surrounding the disk 3. The protective hood 7 is formed with an abutment shoulder 8 which is provided to facilitate mounting, that is, to limit the extent of application of housing 7 towards wall 1; a sealing lip 9 surrounds abutment shoulder 8, resiliently pressing against housing wall 1 and thus providing for sealing thereagainst. The cap or hood 7 is preferably made of plastic material and is secured to the housing wall 1 outside of the region of heat transfer between the semiconductor housing 2, that is, essentially between the semiconductor housing base plate 2b, and the end wall 1 of the semiconductor structure. The hood or cap 7 may be used by itself, that is, without the paint coating 5 (FIGS. 1 and 2) or with the paint coating, the paint coating then being an additional protection; it may be used with a flat end wall, as shown, or with the depressed end wall 1' of FIG. 2.

There are many ways in which the hood or cap 7 can be secured to the housing end wall 1.

The housing end wall is formed with an opening 10a, and the cap 7 is formed with a resilient projection 10, terminating in an end hook. Preferably, two hooks 10 are provided (FIG. 4a) which are placed at opposite sides of the power semiconductor, which is shown only in dashed lines, schematically, in FIG. 4a. The outer circumference, the abutment 8 and sealing lip of cap 7 have been omitted from FIG. 4a. The arrangement may also be made similarly to a bayonet connection. The opening 10'a (FIG. 4b) are so shaped that, upon rotation of the two hooks 10 with respect to the end wall 1 in direction of the arrow A, the hooks at the ends of the projections 10 catch under the housing wall when in their limiting position E (FIG. 4b).

FIG. 5 illustrates a projection 510 extending from the inner surface of cap 7, and secured to end wall 1 by means of ultrasonic riveting.

FIGS. 6a and 6b illustrate attachment of an end pin 610 which is slit crosswise at the end to form an inwardly resiliently depressable hook 11, fitting in the hole in end wall 1. FIG. 7 illustrates an internally tapped projection 710, secured by means of a screw 714 to end wall 1. FIG. 8 illustrates attachment of hood 7 by means of a metal spring 12, with a hook-shaped end, which is molded into the cap 7, and which engages hole 10a of housing end wall 1, similarly to the engagement of hook 10 (FIG. 4).

FIG. 9a and FIG. 9b illustrate connection of a projection 13 secured to cap 7 and formed with a ribbed, sawtooth-shaped end, over which a plastic bushing 14 is pushed. Plastic bushing 14 need not be completely circular and continuous but may be a C-bushing, as seen in FIG. 9b, or it may be circumferentially resilient.

Figure 10A:
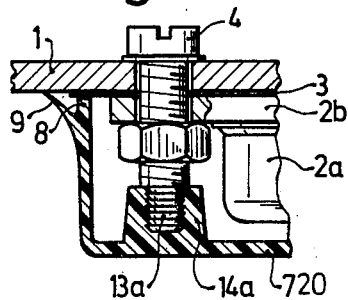
FIG. 10a is a sectional side view of another attachment arrangement.
Figure 11:
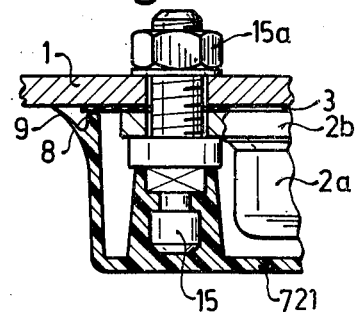
FIG. 11 is a sectional side view of another attachment arrangement.
Figure 10B:
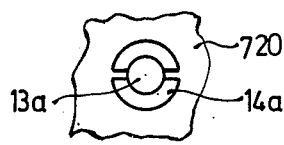

The screws 4 used to attach the semiconductor base plate 2b to the housing end wall 1 may be used additionally to attach the hood 7. FIG. 10a shows that the screw 4 is formed with an extension 13a, which extension is formed with a self-holding ribbed profile, for example of sawtooth-shaped cross section. The cap 720 is formed with an internal projection 14a located to match the position of the extension 13a of screw 4, and to fit about the ribbed extension 13a when the inwardly projecting extensions 14a are snapped over the screw extensions 13a, as clearly seen in FIG. 10a. The inwardly extending extension 14a is preferably transversely slit, as seen in FIG. 10b. FIG. 11 illustrates a fraction of a hood 721 which is formed with an inwardly extending projection in which an attachment bolt 15 is injection-molded. Bolt 15 is so shaped that it only requires a nut 15a on the inside to simultaneously attach the protective hood 721 as well as the semiconductor base plate 2b.

Figure 12A:
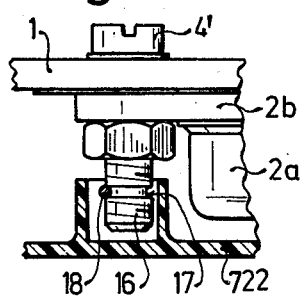
FIGS. 12a and 12b are side views partly in section and an end view of another attachment arrangement.
Figure 12B:
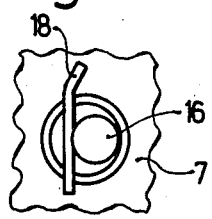

FIGS. 12a and 12b illustrate an arrangement in which the screw 4' which attaches the semiconductor base plate 2b to the housing end wall 1 is extended through the end wall from the inside, the base plate 2b of the transistor housing being held by a counter nut. Screw 4' is formed with an extension 16 which has a circumferential groove 17. The cap 722 has an open, cup-shaped inward extension formed thereon, which has two transversely located holes through which a spring 18 is threaded, the spring 18 being so located that it can snap into the groove 17 in extension 16 of bolt 4', as clearly seen in FIG. 12b. The cap or hood 722 can be made as one injection-molded element, and wire 18 can be molded in, or formed as an inwardly extending yielding plastic ridge.

Figure 13A:
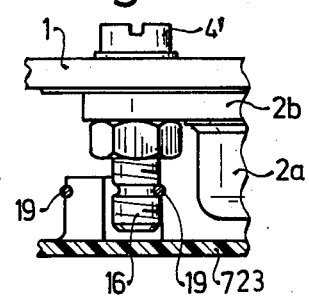
FIG. 13a and 13b are fragmentary side views and an end view of another attachment arrangement.
Figure 14:
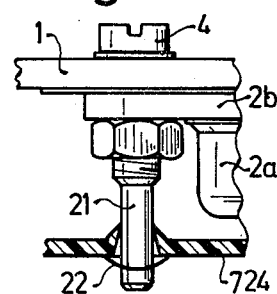
FIG. 14 is another fragmentary side of an attachment arrangement.
Figure 13B:
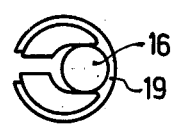

FIGS. 13a and 13b show an arrangement similar to that of FIGS. 12a and 12b, in which the spring 18 is, however, replaced by a C-snap ring 19. Snap ring 19, which need not be of metal, is injection-molded into the inwardly extending projection of cap or hood 723 which, additionally, preferably has locating elements to locate screw extension 16, as clearly seen in FIG. 13b.

FIG. 4 shows an arrangement in which the transistor attachment screw 4" simultaneously is used to attach the protective hood 7. Screw 4" is formed with a pin-like extension 21 which penetrates through hood 724. Pin 21 may be ribbed or smooth, and a self-holding clip 22 is pushed on the extension 21 to securely hold cap 724 in position.

Various changes and modifications may be made, and features described in connection with any one of the embodiments may be used with any of the others, within the scope of the inventive concept.

We claim:

1. Environmentally protected electronic housing structure comprising a housing having an end wall (1) forming a heat sink;
a power semiconductor (2) secured to the housing end wall in good heat-conductive relation;
and protective means (5, 7) covering both said power semiconductor (2) and at least a portion of the housing end wall (1) surrounding the power semiconductor, and being dimensioned to offer little resistance to radiation of heat by said end wall, said protective means comprising a cover cap or hood (7) covering the free surface of the housing (2) of the power semiconductor, the free surface of attachment means (3, 4) to attach the power semiconductor to the housing end wall (1) and the adjacent region of the housing end wall surrounding the power semiconductor, the cap or hood (7) being formed with a circumferential elastic sealing lip (9) and with an abutment shoulder (8) to limit engagement of the cap or hood towards the housing end wall, and to provide for resilient engagement pressure of the sealing lip (9) against the end wall (1) of the housing.

2. Housing structure according to claim 1, wherein the protective means further comprises a paint, lacquer or varnish coating (5) extending over the free surface of the housing (2) of the power semiconductor, the attachment means (3, 4) to attach the power semiconductor to the housing end wall, and the adjacent region surrounding the power semiconductor.

3. Housing structure according to claim 2, further comprising an insulating disk (3) separating the housing (2, 2b) of the power semiconductor and the housing end wall (1), and wherein the paint coating extends beyond the outer edge of the insulating disk (3).

4. Structure according to claim 3, wherein (FIG. 2) the power semiconductor (2) has a base plate (2b) and the end wall of the housing (1'), in the region of attachment of the power semiconductor, is formed with a depression (6) which is shaped to accept the semiconductor base plate (2b), the insulating disk (3) and any attachment means (4) to attach said semiconductor, the depression being shaped to prevent run-off of the protective paint upon application of the paint (5) and to entirely cover the edge of the base plate (2b) of the power semiconductor (2), the insulating disk (3) and the adjacent region of the housing end wall to prevent establishment of creep paths between the base plate (2b) of the semiconductor (2) and the housing end wall (1').

5. Housing structure according to claim 2, wherein the end wall of the housing, in the region of attachment of the power semiconductor, is formed with a depression (6) which is shaped to accept the power semiconductor and any attachment means (3, 4) to attach said semiconductor, and which is shaped to prevent run-off of the protective paint upon application of the paint (5) to the power semiconductor and the adjacent region or zone of the housing end wall.

6. Housing structure according to claim 2, further comprising interengaging locking and connection means formed on said cap or hood (7) and secured to said housing end wall (1) respectively, said interengaging connection means being relatively located with respect to the power semiconductor elements to be non-interfering with heat transfer from the semiconductor element to the end wall (1) of the housing.

7. Housing structure according to claim 1, further comprising interengaging locking and connection means formed on said cap or hood (7) and secured to said housing end wall (1) respectively, said interengaging connection means being relatively located with respect to the power semiconductor element to be non-interfering with heat transfer from the semiconductor element to the end wall (1) of the housing.

8. Housing structure according to claim 1, further comprising cooperating attachment means formed on the cap or hood (7) and on the housing end wall (1) to hold the cap on the housing end wall.

9. Housing structure according to claim 1, further comprising attachment means (4) to attach the semiconductor housing (2) to the end wall (1) of the housing structure, and cooperating attachment means on the cap (7) cooperating with the semiconductor attachment means to hold the cap on the housing end wall.

10. Housing structure according to claim 9, wherein (FIGS. 10 to 14) the semiconductor attachment means is formed with a shaft, or pin-like extension (13a, 15, 16, 21) and the cooperating attachment means on the cap cooperate with the pin-like extension to hold the cap on the housing end wall.

11. Environmentally protected electronic housing structure comprising a housing having an end wall (1) forming a heat sink;

a power semiconductor (2) secured to the housing end wall in good heat-conductive relation;

and protective means (5, 7) covering both said power semiconductor (2) and at least a portion of the housing end wall (1) surrounding the power semiconductor, and being dimensioned to offer little resistance to radiation of heat by said end wall, said protective means comprising a cover cap or hood (7) covering the free surface of the housing (2) of the power semiconductor, the free surface of attachment means (3, 4) to attach the power semiconductor to the housing end wall (1) and the adjacent region of the housing end wall surrounding the power semiconductor;

attachment means (4) to attach the semiconductor housing (2) to the end wall (1) of the housing structure;

and cooperating attachment means on the cap (7) cooperating with the semiconductor attachment means to hold the cap on the housing end wall (1).

12. Housing structure according to claim 11, wherein the protective means further comprises a paint, lacquer or varnish coating (5) extending over the free surface of the housing (2) of the power semiconductor, the attachment means (3, 4) to attach the power semiconductor to the housing end wall, and the adjacent region surrounding the power semiconductor.

13. Housing structure according to claim 12, further comprising an insulating disk (3) separating the housing (2, 2b) of the power semiconductor and the housing end wall (1), and wherein the paint coating extends beyond the outer edge of the insulating disk (3).

14. Structure according to claim 13, wherein (FIG. 2) the power semiconductor (2) has a base plate (2b) and the end wall of the housing (1'), in the region of attachment of the power semiconductor, is formed with a depression (6) which is shaped to accept the semiconductor base plate (2b), the insulating disk (3) and any attachment means (4) to attach said semiconductor, the depression being shaped to prevent run-off of the protective paint upon application of the paint (5) and to entirely cover the edge of the base plate (2b) of the power semiconductor (2), the insulating disk (3) and the adjacent region of the housing end wall to prevent establishment of creep paths between the base plate (2b) of the semiconductor (2) and the housing end wall (1').

15. Housing structure according to claim 12, wherein the end wall of the housing, in the region of attachment of the power semiconductor, is formed with a depression (6) which is shaped to accept the power semiconductor and any attachment means (3, 4) to attach said semiconductor, and which is shaped to prevent run-off of the protective paint upon application of the paint (5) to the power semiconductor and the adjacent region or zone of the housing end wall.

16. Housing structure according to claim 11, wherein (FIGS. 10 to 14) the semiconductor attachment means is formed with a shaft, or pin-like extension (13a, 15, 16, 21) and the cooperating attachment means on the cap cooperate with the pin-like extension to hold the cap on the housing end wall.

17. Housing structure according to claim 11, wherein the cap or hood (7) is formed with a circumferential elastic sealing lip (9) resiliently engaging the end wall (1) of the housing.

18. Housing structure according to claim 17, wherein the hood or cap (7) is formed with an abutment shoulder (8) to limit engagement of the cap or hood towards the housing end wall, and to provide for engagement pressure of the sealing lip (9).

* * * * *